United States Patent
Kang et al.

(10) Patent No.: US 11,854,919 B2
(45) Date of Patent: Dec. 26, 2023

(54) SEALING COMPOSITION AND SEMICONDUCTOR DEVICE

(71) Applicant: HITACHI CHEMICAL COMPANY, LTD., Tokyo (JP)

(72) Inventors: Dongchul Kang, Tokyo (JP); Takahiro Horie, Tokyo (JP); Kenta Ishibashi, Tokyo (JP); Naoki Namai, Tokyo (JP); Kazuhide Sekiguchi, Tokyo (JP); Keichi Hori, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 1169 days.

(21) Appl. No.: 16/305,285

(22) PCT Filed: May 29, 2017

(86) PCT No.: PCT/JP2017/019913
§ 371 (c)(1),
(2) Date: Nov. 28, 2018

(87) PCT Pub. No.: WO2017/209047
PCT Pub. Date: Dec. 7, 2017

(65) Prior Publication Data
US 2020/0335409 A1 Oct. 22, 2020

(30) Foreign Application Priority Data

May 30, 2016 (JP) .................. 2016-107024
May 30, 2016 (JP) .................. 2016-107025
May 30, 2016 (JP) .................. 2016-107026

(51) Int. Cl.
*H01L 23/29* (2006.01)
*C08L 63/00* (2006.01)
*C08K 3/26* (2006.01)
*C08K 3/22* (2006.01)

(52) U.S. Cl.
CPC .............. *H01L 23/295* (2013.01); *C08K 3/26* (2013.01); *C08L 63/00* (2013.01); *C08K 2003/222* (2013.01); *C08K 2003/2227* (2013.01); *C08L 2203/206* (2013.01); *C08L 2205/025* (2013.01); *C08L 2205/03* (2013.01)

(58) Field of Classification Search
CPC ........ C08L 63/00–10; C09D 163/00–10; C09J 163/00–10; C08J 2363/00–10; H01L 23/295; C08K 2003/222; C08K 2003/2227; C08K 3/26
See application file for complete search history.

(56) References Cited

U.S. PATENT DOCUMENTS

| | | | |
|---|---|---|---|
| 2007/0029682 A1* | 2/2007 | Aoki | H01L 23/293 257/793 |
| 2008/0085969 A1 | 4/2008 | Itoh | |
| 2010/0016498 A1* | 1/2010 | Kaji | C08G 59/245 525/523 |
| 2010/0123101 A1 | 5/2010 | Ono | |
| 2012/0175761 A1 | 7/2012 | Zenbutsu | |

FOREIGN PATENT DOCUMENTS

| | | | |
|---|---|---|---|
| JP | 58174434 A | * | 10/1983 |
| JP | H05-025365 A | | 2/1993 |
| JP | 2003034523 A | * | 2/2003 |
| JP | 2005-001902 A | | 1/2005 |
| JP | 2006257309 A | * | 9/2006 |
| JP | 2008208176 A | * | 9/2008 |
| JP | 2009-029919 A | | 2/2009 |
| JP | 2012149194 A | * | 8/2012 |
| JP | 2015-044898 A | | 3/2015 |
| WO | 02/094905 A1 | | 11/2002 |
| WO | 2008/136272 A1 | | 11/2008 |

OTHER PUBLICATIONS

Partial machine translation of JP-2012149194-A (2012).*
Partial machine translation of JP-2008208176-A (2008).*
Partial machine translation of JP-2006257309-A (2006).*
Partial machine translation of JP-58174434-A (1983).*
Partial machine translation of JP-2003034523-A (generated Aug. 24, 2023).*

* cited by examiner

*Primary Examiner* — Kregg T Brooks
(74) *Attorney, Agent, or Firm* — FITCH, EVEN, TABIN & FLANNERY, LLP

(57) ABSTRACT

A first sealing composition includes an epoxy resin, a curing agent, an inorganic filler, and an unbaked hydrotalcite compound having a mole ratio of Mg ion to Al ion (Mg/Al) of 2.4 or more. A second sealing composition includes an epoxy resin, a curing agent, a hydrotalcite compound represented by Formula (1): $Mg_{1-x}Al_x(OH)_2(CO_3)_{x/2} \cdot mH_2O$, in which each of x and m independently represents a positive number, and a magnesium-containing compound that is different from the hydrotalcite compound. A third sealing composition includes an epoxy resin, a curing agent, a hydrotalcite compound represented by Formula (I), and a magnesium oxide, and a content of the magnesium oxide is from 1 part by mass to 50 parts by mass parts with respect to 100 mass parts of the epoxy resin.

13 Claims, No Drawings

SEALING COMPOSITION AND SEMICONDUCTOR DEVICE

CROSS-REFERENCE TO RELATED APPLICATIONS

This application is a U.S. national phase application filed under 35 U.S.C. § 371 of International Application No. PCT/JP2017/019913, filed May 29, 2017, which claims priority from Japanese patent application 2016-107024, filed May 30, 2016, Japanese patent application 2016-107025, filed May 30, 2016, and Japanese patent application 2016-107026, filed May 30, 2016 which are hereby incorporated herein by reference in their entirety.

TECHNICAL FIELD

The present invention relates to a sealing composition, and a semiconductor device.

RELATED ART

In the past, gold was mainly used as a wire material for semiconductor packages. However, in recent years, there have been an increasing number of cases in which copper is used as a wire material due to a sharp increase in the gold price and the like. Meanwhile, as a sealing composition for sealing a semiconductor package, products containing epoxy resins have been widely used. However, epoxy resins are often synthesized using epichlorohydrin, and base residues derived from epoxy resin tend to remain as wire corrosive impurities in sealing compositions containing such epoxy resins. Since copper is more chemically reactive than gold, corrosion caused by chlorine tends to proceed in the case of copper. In order to improve the reliability of a semiconductor package using copper wire, attempts have been made to allow a sealing composition to include a hydrotalcite compound as an ion trapping agent for trapping impurity ions (see, for example, Patent Documents 1 and 2).

Further, along with the miniaturization and high integration of semiconductor packages in recent years, there is concern that heat generation might occur inside the packages. As heat generation might cause deterioration of performance of an electric component or an electronic part having a semiconductor package, high heat conductivity is required for members for which semiconductor packages are used. In this regard, it has been common to attach a heat spreader to a conventional semiconductor package which is required to have high thermal conductivity.

However, in view of the price increase of metal members used for a heat spreader and the difficulties in weight reduction and the difficulties in molding processing, in recent years, there is a demand to increase thermal conductivity of a sealing material for a semiconductor package instead of attaching a heat spreader. Therefore, attempts have been made to achieve high thermal conductivity by forming an anisotropic structure in a resin in order to realize high thermal conductivity of a sealing material (see, for example, Patent Document 3). Patent Document 3 discloses that high thermal conductivity is achieved by forming an anisotropic structure in a resin, and the thermal conductivity of a cured product of an epoxy resin having an anisotropic structure formed with a mesogen skeleton, which is measured by flat plate comparison (steady state method), is 0.68 W/(m·K) to 1.05 W/(m·K).

RELATED ART DOCUMENT

Patent Document

Patent Document 1: Japanese Patent Application Laid-Open (JP-A) No. 2005-1902
Patent Document 2: JP-A No. 2009-29919
Patent Document 3: WO 02/094905

SUMMARY OF INVENTION

Technical Problem

As a result of studies by the inventors, it was revealed that the semiconductor devices disclosed in Patent Document 1 and Patent Document 2, which were manufactured using a semi-baked hydrotalcite and baked hydrotalcite, still need to be improved in terms of moisture resistance reliability in a state of being applied with a bias voltage.

In view of the above circumstances, a first object of the present invention is to provide a sealing composition, which makes it possible to produce a semiconductor device having excellent moisture resistance reliability in a state of being applied with a bias voltage, and a semiconductor device using the same.

In addition, the thermal conductivity of a cured product of the epoxy resin having an anisotropic structure formed with a mesogen skeleton disclosed in Patent Document 3 still needs to be further improved.

In view of the above circumstances, a second object of the present invention is to provide a sealing composition having thermal conductivity in a state of being cured, the sealing composition which makes it possible to produce a semiconductor device having excellent moisture resistance reliability in a state of being applied with a bias voltage and a semiconductor device using the same.

Solution to Problem

Specific embodiments for achieving the first object include the following embodiments.

<1> A sealing composition containing:
an epoxy resin,
a curing agent,
an inorganic filler, and
an unbaked hydrotalcite compound having a mole ratio of Mg ion to Al ion (Mg/Al) of 2.4 or more.
<2> The sealing composition according to <1>, in which a content of the unbaked hydrotalcite compound is from 1 part by mass to 15 parts by mass with respect to 100 parts by mass of the epoxy resin.
<3> The sealing composition according to <1> or <2>, in which the inorganic filler comprises magnesium oxide.
<4> The sealing composition according to <3>, in which a content of the magnesium oxide is from 1 part by mass to 30 parts by mass with respect to 100 parts by mass of the epoxy resin.
<5> The sealing composition according to any one of <1> to <4>, in which a content of the inorganic filler is from 75% by mass to 97% by mass with respect to the sealing composition.

Specific embodiments for achieving the second object include the following embodiments.

<6> A sealing composition containing:
  an epoxy resin,
  a curing agent,
  a hydrotalcite compound represented by the following Formula (1), and
  a magnesium-containing compound that is different from the hydrotalcite compound,

$$Mg_{1-x}Al_x(OH)_2(CO_3)_{x/2} \cdot mH_2O \quad \text{Formula (1)}$$

in which, in Formula (1), each of x and m independently represents a positive number.
<7> The sealing composition according to <6>, in which a content of the magnesium-containing compound is from 1 part by mass to 30 parts by mass with respect to 100 parts by mass of the epoxy resin.

Specific embodiments for achieving the second object further include the following embodiments.
<8> A sealing composition containing:
  an epoxy resin,
  a curing agent,
  a hydrotalcite compound represented by the following Formula (1), and
  a magnesium oxide,
  in which a content of the magnesium oxide is from 1 mass part to 50 mass parts with respect to 100 mass parts of the epoxy resin,

$$Mg_{1-x}Al_x(OH)_2(CO_3)_{x/2} \cdot mH_2O \quad \text{Formula (1)}$$

in which, in Formula (1), each of x and m independently represents a positive number.
<9> The sealing composition according to <8>, further containing an inorganic filler, in which a content of the inorganic filler is from 75% by mass to 97% by mass with respect to the sealing composition.
<10> The sealing composition according to any one of <6> to <9>, in which a content of the hydrotalcite compound is from 1 part by mass to 15 parts by mass with respect to 100 parts by mass of the epoxy resin.

Specific embodiments for achieving the first object to the second object further include the following embodiments.
<11> The sealing composition according to any one of <1> to <10>, further containing a curing accelerator.
<12> A semiconductor device containing:
  a semiconductor element, and
  a cured product of the sealing composition according to any one of <1> to <10>, which seals the semiconductor element.

Advantageous Effects of Invention

According to the present invention, it is possible to provide a sealing composition, which makes it possible to produce a semiconductor device having excellent moisture resistance reliability in a state of being applied with a bias voltage, and a semiconductor device using the same.

According to the present invention, it is possible to provide a sealing composition having thermal conductivity in a state of being cured, the sealing composition which makes it possible to produce a semiconductor device having excellent moisture resistance reliability in a state of being applied with a bias voltage and a semiconductor device using the same.

DESCRIPTION OF EMBODIMENTS

Hereinafter, embodiments of the present invention will be described in detail. However, the present invention is not limited to the following embodiments. In the following embodiments, the constituent elements (including the element processes and the like) are not indispensable except when particularly explicitly mentioned. The same applies to numerical values and ranges thereof, and does not limit the present invention.

In the present disclosures, the term "process" denotes not only independent processes but also processes that cannot be clearly distinguished from other processes as long as a purpose is accomplished by the process.

In the present disclosures, each numerical range specified using "(from) . . . to . . . " represents a range including the numerical values noted before and after "to" as the minimum value and the maximum value, respectively.

In the present disclosures, each component may include plural kinds of substances corresponding to the component. When plural kinds of substances exist corresponding to a component in the composition, the content means, unless otherwise specified, the total amount of the plural kinds of substances existing in the composition.

In the present disclosures, each component may include plural kinds of particles corresponding to the component. When plural kinds of particles exist corresponding to a component in the composition, the particle diameter means, unless otherwise specified, a value with respect to the mixture of the plural kinds of particles existing in the composition.

In the present disclosures, the term "layer" comprehends herein not only a case in which the layer is formed over the whole observed region where the layer is present, but also a case in which the layer is formed only on part of the region.

<Sealing Composition>

First Embodiment

A sealing composition in the first embodiment includes an epoxy resin, a curing agent, an inorganic filler, and an unbaked hydrotalcite compound having a mole ratio of Mg ion to Al ion (Mg/Al, hereinafter, also referred to as "Mg/Al ratio".) of 2.4 or more (hereinafter, also referred to as "first hydrotalcite compound".) The sealing composition in the first embodiment may include another component(s) such as a curing accelerator.

A semiconductor device produced with the sealing composition in the first embodiment has excellent moisture resistance reliability in a state of being applied with a bias voltage. Although the reason therefor is unclear, it is considered that the Mg/Al ratio of an unbaked first hydrotalcite compound included in the sealing composition in the first embodiment is 2.4 or more so that the layer structure of hydroxide sheets in the hydrotalcite compound is sufficiently maintained, thereby making it possible to obtain sufficient ion trapping effects.

Components in the sealing composition in the first embodiment are described below.

(Epoxy Resin)

The sealing composition in the first embodiment includes an epoxy resin. Type of the epoxy resin is not particularly limited, and conventionally known epoxy resins can be used.

Specific examples of the epoxy resin include: epoxidized novolac resins, such as phenol novolac-type epoxy resins and o-cresol novolac-type epoxy resins, which are obtained by condensation or co-condensation of at least one selected from the group consisting of a phenol compound (e.g., phenol, cresol, xylenol, resorcin, catechol, bisphenol A or bisphenol F) and a naphthol compound (e.g., α-naphthol, β-naphthol and dihydroxynaphthalene) with an aldehyde compound (e.g., formaldehyde, acetaldehyde, propionaldehyde, benzaldehyde or salicylaldehyde) in the presence of an acid catalyst; diglycidyl ethers of at least one selected from the group consisting of bisphenol such as bisphenol A, bisphenol AD, bisphenol F and bisphenol S, and biphenol such as a biphenol substituted with an alkyl group or non-substituted; epoxidation products of phenol-aralkyl resins; epoxidation products of adducted or polyadducted by a phenol compound with at least one selected from the group consisting of dicyclopentadiene and terpene compound; glycidyl ester-type epoxy resins that are obtained by reaction between a polybasic acid such as phthalic acid or dimer acid, and epichlorohydrin; glycidylamine-type epoxy resins that are obtained by reaction between a polyamine such as diaminodiphenylmethane or isocyanuric acid, and epichlorohydrin; linear aliphatic epoxy resins obtained by oxidation of an olefin bond with a peracid such as peracetic acid; and alicyclic epoxy resins. The epoxy resin may be used singly, or in combination of two or more thereof.

From the viewpoint of preventing corrosion of aluminum wiring or copper wiring on an element such as an integrated circuit (IC), it is preferable that a purity of an epoxy resin is increased while an amount of hydrolyzable chlorine is decreased. From the viewpoint of improving moisture resistance of a sealing composition, the amount of hydrolyzable chlorine is preferably 500 ppm by mass or less.

Note that the amount of hydrolyzable chlorine is a value obtained by dissolving 1 g of an epoxy resin as a sample in 30 mL of dioxane, adding 5 mL of a 1N-KOH methanol solution thereto, refluxing the resulting solution for 30 minutes, and conducting potentiometric titration.

(Curing Agent)

The sealing composition in the first embodiment includes a curing agent. The curing agent is not particularly limited, and conventionally known curing agent can be used.

Specific examples of the curing agent include: novolac resins obtained by condensation or co-condensation of at least one selected from the group consisting of a phenol compound (e.g., phenol, cresol, xylenol, resorcin, catechol, bisphenol A or bisphenol F) and a naphthol compound (e.g., α-naphthol, β-naphthol and dihydroxynaphthalene) with an aldehyde compound (e.g., formaldehyde) in the presence of an acid catalyst; phenol-aralkyl resins; and naphthol-aralkyl resins. The curing agent may be used singly, or in combination of two or more thereof. Among them, phenol-aralkyl resins is preferable as a curing agent, from the viewpoint of improving reflow resistance.

A curing agent is added such that the equivalent amount of a functional group of a curing agent (for example, a phenolic hydroxyl group for a novolac resin) with respect to 1 equivalent of an epoxy group of an epoxy resin is preferably from 0.5 equivalents to 1.5 equivalents, and particularly preferably from 0.7 equivalents to 1.2 equivalents.

(Inorganic Filler)

The sealing composition in the first embodiment includes an inorganic filler. As the sealing composition includes an inorganic filler, the sealing composition tends to have decreased hygroscopicity and increased strength in a cured state. Regarding the sealing composition in the first embodiment, a first hydrotalcite compound is not involved as an inorganic filler.

Examples of the inorganic filler include fused silica, crystalline silica, alumina, zircon, magnesium oxide, calcium silicate, calcium carbonate, potassium titanate, silicon carbide, silicon nitride, boron nitride, beryllia, and zirconia. Examples of the inorganic filler exhibiting flame retardant effect include aluminum hydroxide, and zinc borate. Among them, fused silica is preferable from the viewpoint of reducing linear expansion coefficient, and alumina, magnesium oxide and boron nitride are preferable from the viewpoint of high heat conducting property. In particular, magnesium oxide is preferable from the viewpoint of reducing an impurity such as a chloride ion in the sealing composition.

Inorganic fillers may be used singly, or in combination of two or more kinds thereof. In a case in which inorganic fillers are used in combination, for example, two or more inorganic fillers having different components, average particle sizes, shapes, and the like are used in combination.

A shape of the inorganic filler is not particularly limited. For example, the inorganic filler may have a shape such as a powder, spherical, or fiber shape. From the viewpoints of fluidity and mold abrasion resistance when molding of a sealing composition, it is preferable that an inorganic filler has a spherical shape.

A blending amount of the inorganic filler is preferably in a range of from 75% by mass to 97% by mass, and more preferably in a range of from 80% by mass to 95% by mass with respect to a total amount of the sealing composition in the first embodiment, from the viewpoints of hygroscopicity, reduction of the linear expansion coefficient, improvement of strength, and solder heat resistance.

In a case in which magnesium oxide is included as an inorganic filler, a content of magnesium oxide is preferably in a range of from 1 part by mass to 30 parts by mass, and more preferably in a range of from 20 parts by mass to 30 parts by mass with respect to 100 parts by mass of an epoxy resin in the sealing composition in the first embodiment, from the viewpoint of reducing impurities. It is preferable that magnesium oxide is surface-treated with an inorganic substance to reduce hygroscopicity.

(First Hydrotalcite Compound)

The sealing composition in the first embodiment includes a first hydrotalcite compound.

In the present disclosure, the first hydrotalcite compound means an unbaked hydrotalcite compound having a Mg/Al ratio of 2.4 or more. The first hydrotalcite compound is preferable an unbaked hydrotalcite compound represented by the following Formula (1).

$$Mg_{1-x}Al_x(OH)_2(CO_3)_{x/2} \cdot mH_2O \qquad \text{Formula (1)}$$

In Formula (1), each of x and m independently represents a positive number, and a value of $(1-x)/x$ is 2.4 or more.

In Formula (1), x is a positive number, which represents the amount of Mg substituted by Al, and is preferably $0 < x \leq 0.5$, and more preferably $0.20 \leq x \leq 0.33$. m is a positive number of 0 or more.

It is preferable that the first hydrotalcite compound has a structure in which plural hydroxide sheets each represented by $[Mg_{1-x}Al_x(OH)_2]$ are layered and negative ions (carbonate ions) and water molecules are present between hydroxide sheets (between layers). A hydroxide sheet as a whole is positively charged because the divalent metal (Mg) is partially substituted by the trivalent metal (Al). It is thought that the electrostatic balance is kept by incorporation of anions between the layers. It is considered that in a case in which the first hydrotalcite compound is an unbaked hydrotalcite compound represented by Formula (1), the first hydrotalcite compound having the above characteristics effectively functions as an ion trapping agent in the sealing composition in the first embodiment.

It is possible to confirm whether or not the first hydrotalcite compound is in an unbaked state by, for example, X-ray diffraction. In other words, in a case in which both a (001) plane peak that is a peak in the layer direction and a (002) plane peak are observed by X-ray diffraction, it is determined that the hydrotalcite compound is in an unbaked state. More specifically, in a case in which both a (001) plane peak that is a peak in the layer direction and a (002) plane peak are observed at regular intervals at around from 5° to 45° by X-ray diffraction, it is determined that the first hydrotalcite compound is in an unbaked state.

A method of producing the first hydrotalcite compound is not particularly limited. The first hydrotalcite compound can be synthesized by an ordinary method. The Mg/Al ratio of the first hydrotalcite compound can be set to a desired value by, for example, adjusting the mole ratio of an Mg salt to an Al salt used as starting materials.

It is preferable that the first hydrotalcite compound is in the particle form and an average particle size is 250 μm or more. In a case in which the first hydrotalcite compound is in the secondary particle form, the above average particle size means an average particle size of secondary particles.

It is specified in the present disclosure that the average particle size of the first hydrotalcite compound is a value measured using a laser diffraction/scattering particle size distribution analyzer.

A specific surface area of the first hydrotalcite compound is preferably from 10 m²/g to 100 m²/g. The specific surface area of the first hydrotalcite compound is a value measured by the BET method.

A content of the first hydrotalcite compound in the sealing composition in the first embodiment is not particularly limited. From the viewpoint of achieving sufficient moisture resistance reliability, the content of the first hydrotalcite compound is preferably 1 part by mass or more with respect to 100 parts by mass of an epoxy resin in the sealing composition in the first embodiment. From the viewpoint of exerting the effects of other components to a satisfactory extent, the content of the first hydrotalcite compound is preferably 15 parts by mass or less with respect to 100 parts by mass of an epoxy resin in the sealing composition in the first embodiment.

One kind or two or more kinds of first hydrotalcite compounds may be included in the sealing composition in the first embodiment. In a case in which two or more kinds of first hydrotalcite compounds are included, two or more kinds of first hydrotalcite compounds having different Mg/Al ratios, average particle sizes, specific surface areas, or the like can be exemplified.

Examples of the first hydrotalcite compound include a compound in which one of or both of Mg and Al elements is/are substituted by different metal element(s) as long as the effects of the present invention can be achieved.

(Curing Accelerator)

The sealing composition in the first embodiment may further include a curing accelerator. Type of the curing accelerator is not particularly limited, and conventionally known curing accelerators can be used.

Specific examples of the curing accelerator include: cycloamidine compounds such as 1,8-diaza-bicyclo[5.4.0]undecene-7, 1,5-diaza-bicyclo[4.3.0]nonene, 5,6-dibutylamino-1,8-diaza-bicyclo[5.4.0]undecene-7; and compounds having intramolecular polarization that are obtained by adding, to any of these cycloamidine compounds, a compound having a π bond such as maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, diazophenylmethane, or a phenol resin; tertiary amine compounds such as benzyldimethylamine, triethanolamine, dimethylaminoethanol and tris(dimethylaminomethyl)phenol, and derivatives thereof; imidazole compounds such as 2-methylimidazole, 2-phenylimidazole and 2-phenyl-4-methylimidazole, and derivatives of imidazole compounds; organophosphine compounds such as tributylphosphine, methyldiphenylphosphine, triphenylphosphine, tris(4-methylphenyl)phosphine, diphenylphosphine and phenylphosphine; organophosphorus compounds such as compounds having intramolecular polarization that are obtained by adding, to any of these organophosphine compounds, a compound having a π bond such as maleic anhydride, the above-described quinone compound, diazophenylmethane, or a phenol resin; and tetraphenyl boron salts such as tetraphenylphosphonium tetraphenylborate, triphenylphosphine tetraphenylborate, 2-ethyl-4-methylimidazole tetraphenylborate and N-methylmorpholine tetraphenylborate, and derivatives of tetraphenyl boron salts; and adduction poducts between a phosphine compound and tetraphenyl boron salt, adduction products such as triphenylphosphonium—triphenylborane, N-methylmorpholine tetraphenylphosphonium—tetraphenylborate. These curing accelerators may be used singly, or in combination of two or more thereof.

A content of the curing accelerator is preferably from 0.1% by mass to 8% by mass with respect to a total amount of the epoxy resin and the curing agent.

(Ion Trapping Agent)

The sealing composition in the first embodiment may further include an ion trapping agent other than the first hydrotalcite compound. An example of an ion trapping agent is, for example, a compound represented by the following Formula (2).

$$BiO_x(OH)_y(NO_3)_z \hspace{2cm} \text{Formula (2)}$$

In Formula (2), x is 0.9≤x≤1.1, y is 0.6≤y≤0.8, and z is 0.2≤z≤0.4. The compound represented by Formula (2) is available as, for example, IXE500 (trade name), TOAGOSEI CO., LTD.

In a case in which the sealing composition in the first embodiment includes the ion trapping agent other than the first hydrotalcite compound, a content of the first hydrotalcite compound with respect to a total amount of the ion trapping agent is preferably 80% by mass or more, more preferably 90% by mass or more, and still more preferably 95% by mass or more.

(Coupling Agent)

The sealing composition in the first embodiment may further include a coupling agent. Type of a coupling agent is not particularly limited. A conventionally known coupling agent can be used. Examples of a coupling agent include, for example, a silane coupling agent and a titanium coupling agent. Coupling agents may be used singly, or in combination of two or more kinds thereof.

Examples of a silane coupling agent include, for example, vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-aminopropyltriethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, methyltriethoxysilane, N-β-(N-vinylbenzylaminoethyl)-γ-aminopropyltrimethoxysilane, γ-chloropropyltrimethoxysilane, hexamethyldisilane, γ-anilinopropyltrimethoxysilane, vinyltrimethoxysilane, and γ-mercaptopropylmethyldimethoxysilane.

Examples of a titanium coupling agent include, for example, isopropyltriisostearoyltitanate, isopropyltris(dioctylpyrophosphate)titanate, isopropyltri(N-aminoethyl-aminoethyl)titanate, tetraoctylbis(ditridecylphosphite)titanate, tetra(2,2-diallyloxymethyl-1-butyl)bis(ditridecyl phosphite) titanate, bis(dioctylpyrophosphate)oxyacetatetitanate, bis(dioctylpyrophosphate)ethylenetitanate, isopropyltrioctanoyltitanate, isopropyldimethacrylisostearoyltitanate, isopropyltridodecylbenzenesulfonyltitanate, isopropylisostearoyldiacryltitanate, isopropyltri(dioctylphosphate)titanate, isopropyltricumylphenyltitanate, and tetraisopropylbis(dioctylphosphite)titanate.

In a case in which the sealing composition in the first embodiment includes a coupling agent, a content of the coupling agent is preferably 3% by mass or less with respect to the sealing composition in the first embodiment as a whole, and the content is preferably 0.1% by mass or more from the viewpoint of exerting the effects of the coupling agent.

(Mold Release Agent)

The sealing composition in the first embodiment may further include a mold release agent. Type of the mold release agent is not particularly limited, and a conventionally known mold release agent can be used. Specific examples thereof include, for example, a higher fatty acid, a carnauba wax, and a polyethylene wax. The mold release agents may be used singly, or in combination of two or more kinds thereof.

In a case in which the sealing composition in the first embodiment includes the mold release agent, a content of the mold release agent is preferably 10% by mass or less with respect to the total amount of an epoxy resin and a curing agent, and the content is preferably 0.5% by mass or more from the viewpoint of exerting the effects of the mold release agent.

Coloring Agent and Modifier

The sealing composition in the first embodiment may include a coloring agent (for example, carbon black). In addition, the sealing composition in the first embodiment may include a modifier (for example, silicone and silicone rubber). Either coloring agents or modifiers may be used singly, or in combination of two or more kinds thereof.

In a case in which conductive particles of carbon black or the like as a coloring agent are used, a content of conductive particles having particle sizes of 10 μm or larger is preferably 1% by mass or less.

In a case in which the sealing composition in the first embodiment includes conductive particles, a content of conductive particles is preferably 3% by mass or less with respect to the total amount of an epoxy resin and a curing agent.

Second Sealing Composition

A sealing composition in the second embodiment includes an epoxy resin, a curing agent, a hydrotalcite compound represented by the following Formula (1) (hereinafter, also referred to as "second hydrotalcite compound"), and a magnesium-containing compound that is different from the hydrotalcite compound (hereinafter, also referred to as "specific magnesium-containing compound"). The sealing composition in the second embodiment may further include a curing accelerator, an inorganic filler, and another component(s).

$$Mg_{1-x}Al_x(OH)_2(CO_3)_{x/2} \cdot mH_2O \quad \text{Formula (1)}$$

In Formula (1), each of x and m independently represents a positive number.

The sealing composition having excellent thermal conductivity can be obtained by using a second hydrotalcite compound and a specific magnesium-containing compound in combination. Although the reason therefor is unclear, it is considered that a second hydrotalcite compound functions as an ion trapping agent in the sealing composition in the second embodiment and a specific magnesium-containing compound has a feature of trapping ions while functioning as an inorganic filler. In addition, a specific magnesium-containing compound itself has excellent thermal conductivity.

(Epoxy Resin)

The sealing composition in the second embodiment includes an epoxy resin. Type of the epoxy resin is not particularly limited, and conventionally known epoxy resins can be used.

Specifically, the epoxy resins described in the first embodiment may be also used in the second embodiment, and preferable usage of the epoxy resin in the second embodiment is same as described in the first embodiment.

(Curing Agent)

The sealing composition in the second embodiment includes a curing agent. Type of the curing agent is not particularly limited, and conventionally known curing agents can be used.

Specifically, the curing agents described in the first embodiment may be also used in the second embodiment, and preferable usage of the curing agent in the second embodiment is same as described in the first embodiment.

(Hydrotalcite Compound represented by Formula (1))

The sealing composition in the second embodiment includes a second hydrotalcite compound. The second hydrotalcite compound is a hydrotalcite compound represented by the following Formula (1).

$$Mg_{1-x}Al_x(OH)_2(CO_3)_{x/2} \cdot mH_2O \quad \text{Formula (1)}$$

In Formula (1), x is a positive number, which represents the amount of Mg substituted by Al, and is preferably $0 < x \leq 0.5$, and more preferably $0.20 \leq x \leq 0.33$. m is a positive number. The hydrotalcite compound represented by Formula (1) may be available, for example, as DHT-4A, trade name, KYOWA CHEMICAL INDUSTRY Co., Ltd.

In the present disclosures, it is preferable that the second hydrotalcite compound is an unbaked hydrotalcite compound.

It is possible to confirm whether or not the second hydrotalcite compound is in an unbaked state by the same manner described in the sealing composition in the first embodiment.

The second hydrotalcite compound has a structure in which plural hydroxide sheets each represented by $[Mg_{1-x}Al_x(OH)_2]$ are layered and negative ions (carbonate ions) and water molecules are present between hydroxide sheets (between layers). A hydroxide sheet as a whole is positively charged because the divalent metal (Mg) is partially substituted by the trivalent metal (Al). It is thought that the electrostatic balance is kept by incorporation of anions between the layers. It is considered that the second hydrotalcite compound having the above characteristics effectively functions as an ion trapping agent in the sealing composition in the second embodiment.

A method of producing the second hydrotalcite compound is not particularly limited. The second hydrotalcite compound can be synthesized by an ordinary method. The Mg/Al ratio of the second hydrotalcite compound can be set to a desired value by, for example, adjusting the mole ratio of an Mg salt to an Al salt used as starting materials.

It is preferable that the second hydrotalcite compound is in the particle form and an average particle size is 250 µm or more. In a case in which the second hydrotalcite compound is in the secondary particle form, the above average particle size means an average particle size of secondary particles. It is specified in the present disclosure that the average particle size of the second hydrotalcite compound is a value measured using a laser diffraction/scattering particle size distribution analyzer.

A specific surface area of the second hydrotalcite compound is preferably from 10 $m^2/g$ to 100 $m^2/g$. The specific surface area of the second hydrotalcite compound is a value measured by the BET method.

A content of the second hydrotalcite compound in the sealing composition in the second embodiment is not particularly limited. From the viewpoint of achieving sufficient moisture resistance reliability, the content of the second hydrotalcite compound is preferably 1 part by mass or more with respect to 100 parts by mass of an epoxy resin in the sealing composition in the second embodiment. From the viewpoint of exerting the effects of other components to a satisfactory extent, the content of the second hydrotalcite compound is preferably 15 parts by mass or less with respect to 100 parts by mass of an epoxy resin in the sealing composition in the second embodiment.

One kind or two or more kinds of second hydrotalcite compounds may be included in the sealing composition in the second embodiment. In a case in which two or more kinds of second hydrotalcite compounds are included, two or more kinds of second hydrotalcite compounds having different Mg/Al ratios, average particle sizes, specific surface areas, or the like can be exemplified.

Examples of the second hydrotalcite compound include a compound in which one of or both of Mg and Al elements is/are substituted by different metal element(s) as long as the effects of the present invention can be achieved.

(Ion Trapping Agent)

The sealing composition in the second embodiment may further include an ion trapping agent other than the second hydrotalcite compound. Type of the ion trapping agent is not particularly limited, and conventionally known ion trapping agents can be used.

Specifically, the ion trapping agents described in the first embodiment may be used in the second embodiment, and preferable usage of the ion trapping agent in the second embodiment is same as described in the first embodiment.

(Specific Magnesium-Containing Compound)

The sealing composition in the second embodiment includes a specific magnesium-containing compound. A specific magnesium-containing compound is a magnesium-containing compound other than a second hydrotalcite compound. As the sealing composition in the second embodiment contains a specific magnesium-containing compound, a cured product of the sealing composition has improved thermal conductivity.

An example of a specific magnesium-containing compound is, for example, magnesium oxide. Specific magnesium-containing compounds may be used singly, or in combination of two or more kinds thereof.

A specific magnesium-containing compound is preferably magnesium oxide from the viewpoint of reducing chloride ions in extracted water in the sealing composition in the second embodiment. In addition, it is preferable that a specific magnesium-containing compound is surface-treated with an inorganic substance from the viewpoint of reducing hygroscopicity.

A content of the specific magnesium-containing compound is preferably in a range of from 1 part by mass to 30 parts by mass, and more preferably in a range of from 20 parts by mass to 30 parts by mass with respect to 100 parts by mass of an epoxy resin from the viewpoint of reducing chloride ions in extracted water.

(Curing Accelerator)

The sealing composition in the second embodiment may further include a curing accelerator. Type of the curing accelerator is not particularly limited, and conventionally known curing accelerators can be used.

Specifically, the curing accelerators described in the first embodiment may be also used in the second embodiment, and preferable usage of the curing accelerator in the second embodiment is same as described in the first embodiment.

(Inorganic Filler)

The sealing composition in the second embodiment may further include an inorganic filler. As the sealing composition includes the inorganic filler, the sealing composition in the second embodiment tends to have decreased hygroscopicity and increased strength in a cured state. Regarding the sealing composition in the second embodiment, the second hydrotalcite compound and the specific magnesium-containing compound are not involved as an inorganic filler.

Material of the inorganic filler is not particularly limited, and conventionally known inorganic fillers can be used. Examples of the inorganic filler include fused silica, crystalline silica, alumina, zircon, calcium silicate, calcium carbonate, potassium titanate, silicon carbide, silicon nitride, boron nitride, beryllia, and zirconia. Examples of the inorganic filler exhibiting flame retardant effect include aluminum hydroxide, a complex metal hydroxide, zinc borate and zinc molybdate. Among them, fused silica is preferable from the viewpoint of reducing linear expansion coefficient, and alumina and boron nitride are preferable from the viewpoint of high heat conducting property.

Inorganic fillers may be used singly, or in combination of two or more kinds thereof. In a case in which inorganic fillers are used in combination, for example, two or more inorganic fillers having different components, average particle sizes, shapes, and the like are used in combination.

A shape of the inorganic filler is not particularly limited. For example, the inorganic filler may have a shape such as a powder, spherical, or fiber shape. From the viewpoints of fluidity and mold abrasion resistance when molding of a sealing composition, it is preferable that an inorganic filler has a spherical shape.

In a case in which the sealing composition includes the inorganic fillers, a total content of the inorganic fillers and the specific magnesium-containing compound is preferably in a range of from 75% by mass to 97% by mass, and more preferably in a range of from 80% by mass to 95% by mass with respect to a total amount of the sealing composition, from the viewpoints of hygroscopicity, reduction of the linear expansion coefficient, improvement of strength, and solder heat resistance.

(Coupling Agent)

The sealing composition in the second embodiment may further include a coupling agent. Type of the coupling agent is not particularly limited, and conventionally known coupling agents can be used. For example, the coupling agents described in the first embodiment may be also used in the second embodiment, and preferable usage of the coupling agent in the second embodiment is same as described in the first embodiment.

(Mold Release Agent)

The sealing composition in the second embodiment may further include a mold release agent. Type of the mold release agent is not particularly limited, and conventionally known mold release agents can be used. Specifically, the mold release agents described in the first embodiment may be also used in the second embodiment, and preferable usage of the mold release agent in the second embodiment is same as described in the first embodiment.

(Coloring Agent and Modifier)

The sealing composition in the second embodiment may include a coloring agent (for example, carbon black). In addition, the sealing composition in the second embodiment may include a modifier (for example, silicone and silicone rubber). Types of the coloring agent and the modifier are not particularly limited, and conventionally known mold coloring agents and modifiers can be used. Specifically, the mold coloring agents and the modifiers described in the first embodiment may be also used in the second embodiment, and preferable usages of the mold coloring agents and the modifiers in the second embodiment are same as described in the first embodiment.

(Third Sealing Composition)

A sealing composition in the third embodiment includes an epoxy resin, a curing agent, a hydrotalcite compound represented by the following Formula (1) (hereinafter, also referred to as "second hydrotalcite compound"), and a magnesium-containing compound, in which a content of the magnesium oxide is from 1 mass part to 50 mass parts with respect to 100 mass parts of the epoxy resin. The sealing composition in the third embodiment may further include a curing accelerator, a inorganic filler, and another component(s).

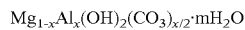

$$Mg_{1-x}Al_x(OH)_2(CO_3)_{x/2} \cdot mH_2O \qquad \text{Formula (1)}$$

In Formula (1), each of x and m independently represents a positive number.

Due to using a second hydrotalcite compound and magnesium oxide in combination, a sealing composition which makes it possible to produce a semiconductor device having thermal conductivity and excellent moisture resistance reliability in a state of being applied with a bias voltage can be obtained. Although the reason therefor is unclear, it is considered that a sealing composition including magnesium oxide having higher thermal conductivity than that of alumina usually used as an inorganic filler can achieve high thermal conductivity. It is also considered that since the content of magnesium oxide is in a range of from 1 part by mass to 50 parts by mass with respect to 100 parts by mass of the epoxy resin, a sealing composition can achieve high thermal conductivity while suppressing reduction of properties thereof such as fluidity and curing performance, which is caused by an increase in an amount of the inorganic filler. Further, it is considered that in a case in which the hydrotalcite compound included as an ion trapping agent is unbaked, such unbaked hydrotalcite has a well-maintained layer structure of hydroxide sheets as compared with baked hydrotalcite and thus exerts excellent ion-trapping effects, thereby contributing to the improvement of moisture resistance reliability.

(Epoxy Resin)

The sealing composition in the third embodiment includes an epoxy resin. Type of the epoxy resin is not particularly limited, and conventionally known epoxy resins can be used.

Specifically, the epoxy resins described in the first embodiment may be also used in the third embodiment, and preferable usage of the epoxy resin in the third embodiment is same as described in the first embodiment.

(Curing Agent)

The sealing composition in the third embodiment includes a curing agent. Type of the curing agent is not particularly limited, and conventionally known curing agents can be used.

Specifically, the curing agents described in the first embodiment may be also used in the third embodiment, and preferable usage of the curing agent in the third embodiment is same as described in the first embodiment.

(Hydrotalcite Compound represented by Formula (1))

The sealing composition in the third embodiment includes a second hydrotalcite compound. The second hydrotalcite compound is a hydrotalcite compound represented by the following Formula (1).

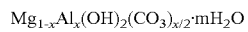

$$Mg_{1-x}Al_x(OH)_2(CO_3)_{x/2} \cdot mH_2O \qquad \text{Formula (1)}$$

In Formula (1), x is a positive number, which represents the amount of Mg substituted by Al, and is preferably $0<x\leq0.5$, and more preferably $0.20\leq x\leq0.33$. m is a positive number.

The second hydrotalcite compounds described in the second embodiment may be also used in the third embodiment, and preferable usage of the second hydrotalcite compound in the third embodiment is same as described in the second embodiment.

(Ion Trapping Agent)

The sealing composition in the second embodiment may further include an ion trapping agent other than the second hydrotalcite compound. Specifically, the ion trapping agents described in the first embodiment may be used in the third embodiment, and preferable usage of the ion trapping agent in the third embodiment is same as described in the first embodiment.

(Magnesium Oxide)

The sealing composition in the third embodiment includes magnesium oxide. The sealing composition having excellent thermal conductivity can be obtained by using magnesium oxide. Further, it is preferable to use magnesium oxide from the viewpoint of reducing chloride ions in extracted water in the sealing composition in the third embodiment. In addition, it is preferable that magnesium oxide is surface-treated with an inorganic substance from the viewpoint of reducing hygroscopicity.

A content of magnesium oxide is preferably in a range of from 1 part by mass to 30 parts by mass, and more preferably in a range of from 20 parts by mass to 30 parts by mass with respect to 100 parts by mass of an epoxy resin from the viewpoint of reducing chloride ions in extracted water.

(Curing Accelerator)

The sealing composition in the third embodiment may further include a curing accelerator. Type of the curing accelerator is not particularly limited, and conventionally known curing accelerators can be used.

Specifically, the curing accelerators described in the first embodiment may be also used in the third embodiment, and preferable usage of the curing accelerator in the third embodiment is same as described in the first embodiment.

(Inorganic Filler)

The sealing composition in the second embodiment may further include an inorganic filler. As the sealing composition includes the inorganic filler, the sealing composition in the second embodiment tends to have decreased hygroscopicity and increased strength in a cured state. Regarding the sealing composition in the third embodiment, the second hydrotalcite compound and the magnesium oxide are not involved as an inorganic filler.

Material of the inorganic filler is not particularly limited, and conventionally known inorganic fillers can be used. The inorganic fillers described in the second embodiment may be also used in the third embodiment, and preferable usage of the inorganic filler in the third embodiment is same as described in the second embodiment.

Inorganic fillers may be used singly, or in combination of two or more kinds thereof. In a case in which inorganic fillers are used in combination, for example, two or more inorganic fillers having different components, average particle sizes, shapes, and the like are used in combination.

A shape of the inorganic filler is not particularly limited. For example, the inorganic filler may have a shape such as a powder, spherical, or fiber shape. From the viewpoints of fluidity and mold abrasion resistance when molding of a sealing composition, it is preferable that an inorganic filler has a spherical shape.

In a case in which the sealing composition includes the inorganic fillers, a total content of the inorganic fillers and magnesium oxide d is preferably in a range of from 75% by mass to 97% by mass, and more preferably in a range of from 80% by mass to 95% by mass with respect to a total amount of the sealing composition, from the viewpoints of hygroscopicity, reduction of the linear expansion coefficient, improvement of strength, and solder heat resistance.

(Coupling Agent)

The sealing composition in the third embodiment may further include a coupling agent. Type of the coupling agent is not particularly limited, and conventionally known coupling agents can be used. For example, the coupling agents described in the first embodiment may be also used in the third embodiment, and preferable usage of the coupling agent in the third embodiment is same as described in the first embodiment.

(Mold Release Agent)

The sealing composition in the third embodiment may further include a mold release agent. Type of the mold release agent is not particularly limited, and conventionally known mold release agents can be used. Specifically, the mold release agents described in the first embodiment may be also used in the third embodiment, and preferable usage of the mold release agent in the third embodiment is same as described in the first embodiment.

(Coloring Agent and Modifier)

The sealing composition in the third embodiment may include a coloring agent (for example, carbon black). In addition, the sealing composition in the third embodiment may include a modifier (for example, silicone and silicone rubber). Types of the coloring agent and the modifier are not particularly limited, and conventionally known mold coloring agents and modifiers can be used. Specifically, the mold coloring agents and the modifiers described in the first embodiment may be also used in the third embodiment, and preferable usages of the mold coloring agents and the modifiers in the third embodiment are same as described in the first embodiment.

Method for Preparing Sealing Composition in First to Third Embodiments

A method of preparing a sealing composition in the first to third embodiments is not particularly limited and the sealing composition can be produced by a conventionally known method. For example, the sealing composition can be prepared by thoroughly mixing a mixture of starting materials in predetermined blending amounts by a mixer or the like, kneading the mixture by a hot roll, an extruder or the like, and treating the mixture by cooling, pulverization, and the like. The form of a sealing composition is not particularly limited. A sealing composition may be in the form of a powder, solid, liquid, or the like.

<Semiconductor Device>

A semiconductor device in the present embodiment includes: a semiconductor element; and a cured product of the sealing composition in the first, second or third embodiment, which seals the semiconductor element.

A method of sealing a semiconductor element (electronic part) using the sealing composition in the first, second, or third embodiment is not particularly limited. A conventionally known method can be applied. For example, low pressure transfer molding is common, and injection molding, compression molding, casting, or the like may be employed.

The semiconductor device in the present embodiment has excellent moisture resistance reliability in a state of being applied with a bias voltage and thus tends to suppress the occurrence of leakage defects, short-circuit between wires, wire open failures, and the like. Further, even in a case in which a semiconductor device includes copper wire, the semiconductor device can suppress an increase in resistance due to corrosion of copper wire. Therefore, the semiconductor device in the present embodiment is favorably used for an integrated circuit (IC), large-scale integration (LSI), and the like.

EXAMPLES

Hereinafter, examples of the present invention will be explained, but a scope of the present invention is not intended to be limited to these Examples. It is noted here that, unless otherwise specified, a unit of values in Table are part(s) by mass.

Examples 1A to 4A and Comparative Examples 1A to 4A

After premixing (dry blending) of materials to be blended as shown in Table 1, each mixture was kneaded for about 15 minutes with a biaxial roll (roll surface temperature: about 80° C.) and cooled and pulverized, thereby producing a sealing composition in the powder form.

The composition used was the same in each of the following combination except that type of hydrotalcite was changed: Example 1A and Comparative Example 1A, Example 2A and Comparative Example 2A, Example 3A and Comparative Example 3A, and Example 4A and Comparative Example 4A.

TABLE 1

|  |  | Example 1A | Comparative Example 1A | Example 2A | Comparative Example 2A | Example 3A | Comparative Example 3A | Example 4A | Comparative Example 4A |
|---|---|---|---|---|---|---|---|---|---|
| Epoxy Resin | E1 | 80 | 80 |  |  |  |  |  |  |
|  | E2 | 20 | 20 | 30 | 30 | 25 | 25 | 60 | 60 |
|  | E3 |  |  | 70 | 70 |  |  |  |  |
|  | E4 |  |  |  |  | 30 | 30 |  |  |
|  | E5 |  |  |  |  | 45 | 45 |  |  |
|  | E6 |  |  |  |  |  |  | 40 | 40 |
| Curing Agent | H1 | 56.3 | 56.3 |  |  |  |  |  |  |
|  | H2 |  |  |  |  |  |  |  |  |
|  | H3 |  |  | 59.4 | 59.4 | 80.8 | 80.8 | 79.8 | 79.8 |
| Curing Accelerator | HA1 | 3.5 | 3.5 |  |  |  |  |  |  |
|  | HA2 |  |  | 2.52 | 2.52 | 3 | 3 | 3.5 | 3.5 |
| Hydrotalcite Compound | HT1 | 10 |  | 10 |  | 10 |  | 10 |  |
|  | HT2 |  | 10 |  | 10 |  | 10 |  | 10 |
| Inorganic Filler | Mg1 | 30 | 30 | 30 | 30 | 30 | 30 | 30 | 30 |
|  | Si1 | 1986 | 1986 | 1363 | 1363 | 1628 | 1628 | 1413 | 1413 |

Details of materials in Table 1 are described below.
(Epoxy Resin)
E1: YSLV-80XY, trade name, NIPPON STEEL & SUMIKIN CHEMICAL CO., LTD.
E2: YX-4000, trade name, Yuka-Shell Epoxy Co. Ltd.
E3: HP-5000, trade name, DIC Corporation
E4: CER-3000L, trade name, Nippon Kayaku Co., Ltd.
E5: YSLV-120TE, trade name, NIPPON STEEL & SUMIKIN CHEMICAL CO., LTD.
E6: NC-3000, trade name, Nippon Kayaku Co., Ltd.
(Curing Agent)
H1: HE910, trade name, AIR WATER INC.
H2: HE200C, trade name, AIR WATER INC.
H3: MEH-7800, trade name, MEIWA PLASTIC INDUSTRIES, LTD.
(Curing Accelerator)
HA1: Triphenylphosphine
HA2: Adduct of triphenylphosphine and 1,4-benzoquinone
(Hydrotalcite Compound)
HT1: Mg/Al≈3.0, unbaked type
HT2: Mg/Al≈2.5, baked type
(Inorganic Filler)
Mg1: Magnesium oxide
Si1: Spherical fused silica Each of the obtained sealing compositions was used for sealing a semiconductor element by a transfer molding machine under the following conditions: a mold temperature of from 175° C. to 180° C., a molding pressure of 17 kgf/cm$^2$ (1.67 MPa), and a curing time of 90 seconds, thereby preparing a test piece to be used for evaluation by the highly accelerated temperature and humidity stress test (HAST) described below. Each test piece included a pad (Al/Si/Cu=98.9%/0.8%/0.3%; width: 60 μm) as an electrode and a pure copper wire (diameter: 20 μm) as a wire.

(Test Method)
Each prepared test piece was placed in a high temperature and high humidity tank at 130° C. in an atmosphere with humidity of 85%, a voltage of 5 V was applied, and in-tank HAST was carried out for 24, 48, 96, 168, and 336 hours in total. Electric characteristics were evaluated after the elapse of each of the above periods of time as "NG" for a test piece with wire opening (indicating a resistance increase of 100%) and "OK" for a test piece with a resistance increase of less than 100%.

Table 2 shows the results of HAST. The results of HAST for Examples 1A to 4A, in which the Mg/Al ratio was high and the unbaked type hydrotalcite compound (HT-1) was used, were favorable as compared with the results in Comparative Examples 1A to 4A.

TABLE 2

|  | 0 h | 24 h | 48 h | 96 h | 168 h | 336 h |
|---|---|---|---|---|---|---|
| Example 1A | OK | OK | OK | OK | OK | OK |
| Comparative Example 1A | OK | OK | OK | NG | — | — |
| Example 2A | OK | OK | OK | OK | OK | OK |
| Comparative Example 2A | OK | OK | OK | NG | — | — |
| Example 3A | OK | OK | OK | OK | OK | OK |
| Comparative Example 3A | OK | OK | OK | OK | NG |  |
| Example 4A | OK | OK | OK | OK | OK | OK |
| Comparative Example 4A | OK | OK | OK | NG | — | — |

Examples 5A and 6A and Comparative Examples 5-1A to 5-3A)

Sealing compositions in the powder form and test pieces were prepared using materials to be blended as shown in Table 3 and HAST was carried out in the manner described in the above Examples.

The unbaked type hydrotalcite compound was used in each of Examples 5A and 6A and Comparative Examples 5-1A to 5-3A. In addition, a hydrotalcite compound having a Mg/Al ratio of 2.4 or more was used in Examples 5A and 6A, and a hydrotalcite compound having a Mg/Al ratio of less than 2.4 was used in Comparative Examples 5-1A to 5-3A.

TABLE 3

|  |  | Example 5A | Comparative Example 5-1A | Comparative Example 5-2A | Comparative Example 5-3A | Example 6A |
|---|---|---|---|---|---|---|
| Epoxy Resin | E1 | 80 | 80 | 80 | 80 | 80 |
|  | E2 | 20 | 20 | 20 | 20 | 20 |
| Curing Agent | H1 | 39.4 | 39.4 | 39.4 | 39.4 | 39.4 |
|  | H2 | 32.3 | 32.3 | 32.3 | 32.3 | 32.3 |
| Curing Accelerator | HA1 | 4 | 4 | 4 | 4 | 4 |
| Hydrotalcite Compound | HT1 | 10 |  |  |  |  |
|  | HT3 |  | 10 |  |  |  |
|  | HT4 |  |  | 10 |  |  |
|  | HT5 |  |  |  | 10 |  |
|  | HT6 |  |  |  |  | 10 |
| Inorganic Filler | Mg1 | 30 | 30 | 30 | 30 | 30 |
|  | Si1 | 1731 | 1731 | 1731 | 1731 | 1731 |

Details of materials in Table 3 are described below.
E1: YSLV-80XY, trade name, NIPPON STEEL & SUMIKIN CHEMICAL CO., LTD.
E2: YX-4000, trade name, Yuka-Shell Epoxy Co. Ltd.
H1: HE910, trade name, AIR WATER INC.
H2: HE200C, trade name, AIR WATER INC.
HA1: Triphenylphosphine
HT1: Mg/Al≈3.0, unbaked type
HT3: Mg/Al≈0.6, unbaked type
HT4: Mg/Al≈1.8, unbaked type
HT5: Mg/Al≈2.1, unbaked type
HT6: Mg/Al≈2.7, unbaked type
Mg1: Magnesium oxide
Si1: Spherical fused silica Table 4 shows the results of HAST. As a result, it was found that as the Mg/Al ratio increases, the results of HAST are improved.

TABLE 4

|  | Time elapsed ||||||
|---|---|---|---|---|---|---|
|  | 0 h | 24 h | 48 h | 96 h | 168 h | 336 h |
| Example 5A | OK | OK | OK | OK | OK | OK |
| Comparative Example 5-1A | OK | OK | NG | — | — | — |
| Comparative Example 5-2A | OK | OK | NG | — | — | — |
| Comparative Example 5-3A | OK | OK | OK | NG | — | — |
| Example 6A | OK | OK | OK | OK | OK | NG |

Examples 7A to 8A and Comparative Examples 6A to 9A)

Sealing compositions in the powder form and test pieces were prepared using materials to be blended as shown in Table 5 and HAST was carried out in the manner described in the above Examples.

The composition used was the same in Examples 7A and 8A and Comparative Examples 6A to 9A, respectively, except that type of hydrotalcite was changed. In addition, in order to verify the difference between a case in which unbaked type hydrotalcite was used and a case in which baked type hydrotalcite was used, baked type hydrotalcite and unbaked type hydrotalcite each having the same Mg/Al ratio were used in each of the following combination: Example 7A and Comparative Example 6A, Comparative Example 7A and Comparative Example 8A, and Example 8A and Comparative Example 9A.

TABLE 5

|  |  | Example 7A | Comparative Example 6A | Comparative Example 7A | Comparative Example 8A | Example 8A | Comparative Example 9A |
|---|---|---|---|---|---|---|---|
| Epoxy Resin | E1 | 80 | 80 | 80 | 80 | 80 | 80 |
|  | E2 | 20 | 20 | 20 | 20 | 20 | 20 |
| Curing Agent | H1 | 39.4 | 39.4 | 39.4 | 39.4 | 39.4 | 39.4 |
|  | H2 | 32.3 | 32.3 | 32.3 | 32.3 | 32.3 | 32.3 |
| Curing Accelerator | HA1 | 4 | 4 | 4 | 4 | 4 | 4 |
| Hydrotalcite Compound | HT1 | 10 |  |  |  |  |  |
|  | HT7 |  | 10 |  |  |  |  |
|  | HT3 |  |  | 10 |  |  |  |
|  | HT8 |  |  |  | 10 |  |  |
|  | HT6 |  |  |  |  | 10 |  |
|  | HT9 |  |  |  |  |  | 10 |
| Inorganic Filler | Mg1 | 30 | 30 | 30 | 30 | 30 | 30 |
|  | Si1 | 1731 | 1731 | 1731 | 1731 | 1731 | 1731 |

Details of materials in Table 5 are described below.
E1: YSLV-80XY, trade name, NIPPON STEEL & SUMIKIN CHEMICAL CO., LTD.
E2: YX-4000, trade name, Yuka-Shell Epoxy Co. Ltd.
H1: HE910, trade name, AIR WATER INC.
H2: HE200C, trade name, AIR WATER INC.
HA1: Triphenylphosphine
HT1: Mg/Al≈3.0, unbaked type
HT3: Mg/Al≈0.6, unbaked type
HT6: Mg/Al≈2.7, unbaked type
HT7: Mg/Al≈3.0, baked type
HT8: Mg/Al≈0.6, baked type
HT9: Mg/Al≈2.7, baked type
Mg1: Magnesium oxide
Si1: Spherical fused silica Table 6 shows the results of HAST. As a result, it was found that in a case in which the Mg/Al ratio of a hydrotalcite compound is the same, favorable results are obtained by using an unbaked type composition as compared with a baked type composition. It was also found that this tendency is observed regardless of the Mg/Al ratio of a hydrotalcite compound. Note that in a case in which the Mg/Al ratio was not less than 2.4, the effects of using an unbaked type composition rather than a baked type composition were intensified as compared with the case in which the Mg/Al ratio was less than 2.4.

TABLE 6

| | Time elapsed | | | | | |
|---|---|---|---|---|---|---|
| | 0 h | 24 h | 48 h | 96 h | 168 h | 336 h |
| Example 7A | OK | OK | OK | OK | OK | OK |
| Comparative Example 6A | OK | OK | OK | NG | — | — |
| Comparative Example 7A | OK | OK | NG | — | — | — |
| Comparative Example 8A | OK | NG | — | — | — | — |
| Example 8A | OK | OK | OK | OK | OK | NG |
| Example 9A | OK | OK | OK | NG | — | — |

<Examination of Results>

In the past, it has been said that a baked type hydrotalcite compound is excellent in moisture resistance reliability because favorable results can be obtained upon impurity extract measurement. This was because since baked type hydrotalcite has a highly porous surface portion as a result of baking, which results in a very high surface area, baked type hydrotalcite has higher surface trapping ability than that of an unbaked type hydrotalcite compound in which ions are trapped between layers.

However, high ability to maintain trapped ions is required in HAST in which a bias voltage is applied. Therefore, the above test suggests that surface trapping ability itself is insufficient.

Based on the above, according to the present invention, it is found that it is possible to provide a sealing composition which makes it possible to produce a semiconductor device having excellent moisture resistance reliability in a state of being applied with a bias voltage and such a semiconductor device.

Examples 1B to 4B and Comparative Examples 1B to 4B

After premixing of components in Table 7 by a mixer or the like, each mixture was kneaded with a hot roll (roll surface temperature: about 80° C.), an extruder, or the like, cooled, and pulverized, thereby producing a sealing composition in the powder form. The composition used was the same in each of the following combination except for the presence or absence of a specific magnesium-containing compound: Example 1B and Comparative Example 1B, Example 2B and Comparative Example 2B, Example 3B and Comparative Example 3B, and Example 4B and Comparative Example 4B.

TABLE 7

| | | Example 1B | Comparative Example 1B | Example 2B | Comparative Example 2B | Example 3B | Comparative Example 3B | Example 4B | Comparative Example 4B |
|---|---|---|---|---|---|---|---|---|---|
| Epoxy Resin | E1 | 80 | 80 | | | | | | |
| | E2 | 20 | 20 | 30 | 30 | 25 | 25 | 60 | 60 |
| | E3 | | | 70 | 70 | | | | |
| | E4 | | | | | 30 | 30 | | |
| | E5 | | | | | 45 | 45 | | |
| | E6 | | | | | | | 40 | 40 |
| Curing Agent | H1 | 56.3 | 56.3 | | | | | | |
| | H2 | | | 59.4 | 59.4 | 80.8 | 80.8 | 79.8 | 79.8 |
| Curing Accelerator | HA1 | 3.5 | 3.5 | | | | | | |
| | HA2 | | | 2.52 | 2.52 | 3 | 3 | 3.5 | 3.5 |
| Hydrotalcite Compound | HT1 | 10 | 10 | 10 | 10 | 10 | 10 | 10 | 10 |
| Specific Magnesium-containing Compound | Mg1 | 30 | | 30 | | 30 | | 30 | |
| Inorganic Filler | Si1 | 1986 | 1956 | 1091 | 1067 | 980 | 962 | | |
| | Al1 | | | 272 | 266 | 648 | 636 | 1413 | 1383 |

Details of materials in Table 7 are described below.
E1: YSLV-80XY, trade name, NIPPON STEEL & SUMIKIN CHEMICAL CO., LTD.
E2: YX-4000, trade name, Yuka-Shell Epoxy Co. Ltd.
E3: HP-5000, trade name, DIC Corporation
E4: CER-3000L, trade name, Nippon Kayaku Co., Ltd.
E5: YSLV-120TE, trade name, NIPPON STEEL & SUMIKIN CHEMICAL CO., LTD.
E6: NC-3000, trade name, Nippon Kayaku Co., Ltd.
H1: HE910, trade name, AIR WATER INC.
H2: MEH-7800, trade name, MEIWA PLASTIC INDUSTRIES, LTD.
HA1: Triphenylphosphine
HA2: Adduct of triphenylphosphine and 1,4-benzoquinone
HT1: Hydrotalcite Compound, x≈0.25, unbaked type
Mg1: Magnesium oxide
Si1: Spherical fused silica
Al1: Alumina Each of the obtained sealing compositions was used for sealing a semiconductor element by a compression molding machine under the following conditions: a mold temperature of from 175° C. to 180° C., a molding pressure of 7 MPa, and a curing time of 150 seconds, thereby preparing a test piece to be used for evaluation described below.

<Evaluation>

Thermal conductivity of each test piece was measured by the Xe-flash method. Table 8 shows the results.

As a result, thermal conductivity in Example 1B, in which magnesium oxide was included as a specific magnesium-containing compound, was higher than that in Comparative Example 1B, in which magnesium oxide was not included. Similarly, thermal conductivity was measured using different types of resins, and Examples 2B to Example 4B and Comparative Examples 2B to 4B were compared with each other, respectively. As a result, the values of thermal conductivity in the Examples were greater than those in Comparative Examples regardless of types of resins.

TABLE 8

|  | Thermal Conductivity (W/(m · ° C.) |
| --- | --- |
| Example 1B | 1.6 |
| Comparative Example 1B | 1.0 |
| Example 2B | 3.1 |
| Comparative Example 2B | 2.2 |
| Example 3B | 4.3 |
| Comparative Example 3B | 3.0 |
| Example 4B | 5.5 |
| Comparative Example 4B | 4.1 |

The results in Table 8 revealed that an inorganic filler can be partially substituted by a specific magnesium-containing compound. Accordingly, it is possible to add a specific magnesium-containing compound by replacing alumina or partially replacing alumina, in which alumina has excellent thermal conductivity but cannot be added in a large amount because of inducing reduction of properties such as fluidity and curing performance. A specific magnesium-containing compound itself has higher thermal conductivity than that of silica or alumina, and therefore, it can improve thermal conductivity of a cured product of a sealing resin even when it is not added in a large amount.

The compositions used in Examples 1B to 4B were the same as those in Examples 1A to 4A, respectively. As shown in Table 2, the results of HAST were favorable.

<Preparation of Sealing Composition>

After premixing of materials in Table 9 by a mixer or the like, each mixture was kneaded with a hot roll (roll surface temperature: about 80° C.), an extruder, or the like, cooled, and pulverized, thereby preparing a sealing composition in the powder form. The composition used was the same in each of the following combinations except for the presence or absence of a hydrotalcite compound and magnesium oxide: Example 1C and Comparative Example 1C, Example 2C and Comparative Example 2C, Example 3C and Comparative Example 3C, and Example 4C and Comparative Example 4C.

TABLE 9

|  |  | Example 1C | Comparative Example 1C | Example 2C | Comparative Example 2C | Example 3C | Comparative Example 3C | Example 4C | Comparative Example 4C |
| --- | --- | --- | --- | --- | --- | --- | --- | --- | --- |
| Epoxy Resin | E1 | 80 | 80 |  |  |  |  |  |  |
|  | E2 | 20 | 20 | 30 | 30 | 25 | 25 | 60 | 60 |
|  | E3 |  |  | 70 | 70 |  |  |  |  |
|  | E4 |  |  |  |  | 30 | 30 |  |  |
|  | E5 |  |  |  |  | 45 | 45 |  |  |
|  | E6 |  |  |  |  |  |  | 40 | 40 |
| Curing Agent | H1 | 56.3 | 56.3 |  |  |  |  |  |  |
|  | H2 |  |  | 59.4 | 59.4 | 80.8 | 80.8 | 79.8 | 79.8 |
| Curing Accelerator | HA1 | 3.5 | 3.5 |  |  |  |  |  |  |
|  | HA2 |  |  | 2.52 | 2.52 | 3 | 3 | 3.5 | 3.5 |
| Hydrotalcite Compound | HT1 | 10 |  | 10 |  | 10 |  | 10 |  |
| Specific Magnesium-containing Compound | Mg1 | 50 |  | 50 |  | 50 |  | 50 |  |
| Inorganic Filler | Si1 | 1767 | 1739 | 170 | 170 | 176 | 176 |  |  |
|  | Al1 | 217 | 217 | 1163 | 1193 | 1207 | 1237 | 1598 | 1628 |

Details of materials in Table 9 are described below.
E1: YSLV-80XY, trade name, NIPPON STEEL & SUMIKIN CHEMICAL CO., LTD.
E2: YX-4000, trade name, Yuka-Shell Epoxy Co. Ltd.
E3: HP-5000, trade name, DIC Corporation
E4: CER-3000L, trade name, Nippon Kayaku Co., Ltd.
E5: YSLV-120TE, trade name, NIPPON STEEL & SUMIKIN CHEMICAL CO., LTD.
E6: NC-3000, trade name, Nippon Kayaku Co., Ltd.
H1: HE910, trade name, AIR WATER INC.
H2: MEH-7800, trade name, MEIWA PLASTIC INDUSTRIES, LTD.
HA1: Triphenylphosphine
HA2: Adduct of triphenylphosphine and 1,4-benzoquinone
HT1: Hydrotalcite Compound, x≈0.25, unbaked type
Mg1: Magnesium oxide
Si1: Spherical fused silica
Al1: Alumina
<Evaluation of Thermal Conductivity>

Each of the obtained sealing compositions was used for sealing a semiconductor element by a compression molding machine under the following conditions: a mold temperature of from 175° C. to 180° C., a molding pressure of 7 MPa, and a curing time of 150 seconds, thereby preparing a test piece for thermal conductivity evaluation. Next, thermal conductivity of each test piece was measured by the xenon-flash (Xe-flash) method. Table 10 shows the results.

TABLE 10

|  | Thermal Conductivity (W/(m · ° C.) |
|---|---|
| Example 1C | 1.6 |
| Comparative Example 1C | 1.0 |
| Example 2C | 3.1 |
| Comparative Example 2C | 2.2 |
| Example 3C | 4.3 |
| Comparative Example 3C | 3.0 |
| Example 4C | 5.5 |
| Comparative Example 4C | 4.1 |

As indicated by the results in Table 10, thermal conductivity in Example 1C, in which a hydrotalcite compound and magnesium oxide were included, was higher than that in Comparative Example 1C, in which a hydrotalcite compound and magnesium oxide were not included. Similarly, thermal conductivity was measured using different types of resins, and Examples 2C to Example 4C and Comparative Examples 2C to 4C were compared with each other, respectively. As a result, values of thermal conductivity in the Examples were greater than those in Comparative Examples regardless of types of resins.

<HAST>

Each of the obtained sealing compositions was used for sealing a semiconductor element by a transfer molding machine under the following conditions: a mold temperature of from 175° C. to 180° C., a molding pressure of 17 kgf/cm² (1.67 MPa), and a curing time of 90 seconds, thereby preparing a semiconductor package to be used for evaluation by the highly accelerated temperature and humidity stress test (HAST) described below. A semiconductor package including a pad (Al/Si/Cu=98.9%/0.8%/0.3%; width: 60 µm) as an electrode and pure copper wire (diameter: 20 µm) as wire was used.

Each prepared semiconductor package was placed in a high temperature and high humidity tank at 130° C. in an atmosphere with humidity of 85%, a voltage of 5 V was applied, and in-tank HAST was carried out for 24, 48, 96, 168, and 336 hours in total. Electric characteristics were evaluated after the elapse of each of the above periods of time as "NG" for a semiconductor package with wire opening (indicating a resistance increase of 100%) and "OK" for a semiconductor package with a resistance increase of less than 100%.

TABLE 11

|  | Time elapsed | | | | | |
|---|---|---|---|---|---|---|
|  | 0 h | 24 h | 48 h | 96 h | 168 h | 336 h |
| Example 1C | OK | OK | OK | OK | OK | OK |
| Comparative Example 1C | OK | OK | OK | NG | — | — |
| Example 2C | OK | OK | OK | OK | OK | OK |
| Comparative Example 2C | OK | OK | OK | NG | — | — |
| Example 3C | OK | OK | OK | OK | OK | OK |
| Comparative Example 3C | OK | OK | OK | OK | NG | — |
| Example 4C | OK | OK | OK | OK | OK | OK |
| Comparative Example 4C | OK | OK | OK | NG | — | — |

As indicated by the results in Table 11, the results of HAST in Example 1C, in which a hydrotalcite compound and magnesium oxide were included, were more favorable than those in Comparative Example 1C, in which a hydrotalcite compound and magnesium oxide were not included. Similarly, HAST was carried out using different types of resins, and Examples 2C to Example 4C and Comparative Examples 2C to 4C were compared with each other, respectively. As a result, the results of HAST in the Examples were more favorable than those in the Comparative Examples regardless of types of resins.

Based on the above, it was found that it is possible to provide a sealing composition having high thermal conductivity in a cured state, the sealing composition which makes it possible to produce a semiconductor device having excellent moisture resistance reliability in a state of being applied with a bias voltage and such a semiconductor device according to this embodiment.

The entire contents of the disclosures by Japanese Patent Application Nos. 2016-107024, 2016-107025 and 2016-107026 filed on May 30, 2016 are incorporated herein by reference.

All the document, patent application, and technical standards cited herein are also herein incorporated to the same extent as provided for specifically and severally with respect to an individual document, patent application, and technical standard to the effect that the same should be so incorporated by reference.

The invention claimed is:
1. A sealing composition comprising:
  an epoxy resin,
  a curing agent,
  an inorganic filler comprising magnesium oxide and silica, wherein a ratio by mass of magnesium oxide and silica (magnesium oxide/silica) is 30/1986 to 30/1363 and wherein the magnesium oxide is surface-treated with an inorganic substance to reduce hygroscopicity, and
  an unbaked hydrotalcite compound having a mole ratio of Mg ion to Al ion (Mg/Al) of 2.4 or more.
2. The sealing composition according to claim 1, wherein a content of the unbaked hydrotalcite compound is from 1 part by mass to 15 parts by mass with respect to 100 parts by mass of the epoxy resin.

3. The sealing composition according to claim 1, wherein a content of the magnesium oxide is from 1 part by mass to 30 parts by mass with respect to 100 parts by mass of the epoxy resin.

4. The sealing composition according to claim 1, wherein a content of the inorganic filler is from 75% by mass to 97% by mass with respect to the sealing composition.

5. The sealing composition according to claim 1, further comprising a curing accelerator.

6. A semiconductor device comprising:
a semiconductor element, and
a cured product of the sealing composition according to claim 1, which seals the semiconductor element.

7. A sealing composition comprising:
an epoxy resin,
a curing agent,
a hydrotalcite compound represented by the following Formula (1);
an inorganic filler comprising magnesium oxide and silica, wherein a ratio by mass of magnesium oxide and silica (magnesium oxide/silica) is 30/1986 to 30/1363 and wherein the magnesium oxide is surface-treated with an inorganic substance to reduce hygroscopicity, $$Mg_{1-x}Al_x(OH)_2(CO_3)_{x/2} \cdot mH_2O \quad \text{Formula (1)}$$

wherein, in Formula (1), each of x and m independently represents a positive number.

8. The sealing composition according to claim 7, wherein a content of the magnesium oxide is from 1 part by mass to 30 parts by mass with respect to 100 parts by mass of the epoxy resin.

9. The sealing composition according to claim 7, wherein a content of the hydrotalcite compound is from 1 part by mass to 15 parts by mass with respect to 100 parts by mass of the epoxy resin.

10. A semiconductor device comprising:
a semiconductor element, and
a cured product of the sealing composition according to claim 7, which seals the semiconductor element.

11. A sealing composition comprising:
an epoxy resin,
a curing agent,
a hydrotalcite compound represented by the following Formula (1);
an inorganic filler comprising magnesium oxide and silica, wherein a ratio by mass of magnesium oxide and silica (magnesium oxide/silica) is 30/1986 to 30/1363 and wherein the magnesium oxide is surface-treated with an inorganic substance to reduce hygroscopicity, and
wherein a content of the magnesium oxide is from 1 mass part to 50 mass parts with respect to 100 mass parts of the epoxy resin, $$Mg_{1-x}Al_x(OH)_2(CO_3)_{x/2} \cdot mH_2O \quad \text{Formula (1)}$$

wherein, in Formula (1), each of x and m independently represents a positive number.

12. The sealing composition according to claim 11, wherein a content of the inorganic filler is from 75% by mass to 97% by mass with respect to the sealing composition.

13. A semiconductor device comprising:
a semiconductor element, and
a cured product of the sealing composition according to claim 11, which seals the semiconductor element.

* * * * *